(12) United States Patent
Umeda et al.

(10) Patent No.: US 10,957,630 B2
(45) Date of Patent: Mar. 23, 2021

(54) SEMICONDUCTOR DEVICE AND SEMICONDUCTOR DEVICE MANUFACTURING METHOD

(71) Applicant: SHINDENGEN ELECTRIC MANUFACTURING CO., LTD., Tokyo (JP)

(72) Inventors: Soichiro Umeda, Hanno (JP); Atsushi Kyutoku, Hanno (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 105 days.

(21) Appl. No.: 16/481,971

(22) PCT Filed: Dec. 19, 2018

(86) PCT No.: PCT/JP2018/046875
§ 371 (c)(1),
(2) Date: Jul. 30, 2019

(87) PCT Pub. No.: WO2020/129195
PCT Pub. Date: Jun. 25, 2020

(65) Prior Publication Data
US 2020/0350236 A1 Nov. 5, 2020

(51) Int. Cl.
*H01L 23/00* (2006.01)
*H01L 23/49* (2006.01)
(Continued)

(52) U.S. Cl.
CPC .......... *H01L 23/49* (2013.01); *H01L 21/4871* (2013.01); *H01L 21/4889* (2013.01);
(Continued)

(58) Field of Classification Search
None
See application file for complete search history.

(56) References Cited

U.S. PATENT DOCUMENTS

2007/0136824 A1 6/2007 Chida et al.
2017/0236782 A1 8/2017 Nonaka
(Continued)

FOREIGN PATENT DOCUMENTS

CN 101740527 B 6/2012
EP 2 804 212 11/2014
(Continued)

OTHER PUBLICATIONS

International Search Report for PCT/JP2018/046875 dated Mar. 12, 2019, 3 pages, with an English Translation.
(Continued)

*Primary Examiner* — Reema Patel
(74) *Attorney, Agent, or Firm* — Nixon & Vanderhye P.C.

(57) ABSTRACT

A semiconductor device includes: a circuit unit including a semiconductor chip; a plurality of pin terminals formed in a rod shape extending in a same direction from the circuit unit and electrically connected to the circuit unit; a sealing resin portion sealing the circuit unit and first portions of the plurality of pin terminals positioned on a side of the circuit unit; and a plurality of covering resin portions integrally extending from an outer surface of the sealing resin portion from which second portions of the plurality of pin terminals protrude, the plurality of covering resin portions being formed in a cylindrical shape respectively covering base end portions of the second portions of the plurality of pin terminals, which are positioned on a side of the sealing resin portion.

10 Claims, 5 Drawing Sheets

(51) Int. Cl.
*H01L 21/48* (2006.01)
*H01L 21/56* (2006.01)
*H01L 23/31* (2006.01)
*H01L 23/373* (2006.01)

(52) U.S. Cl.
CPC ........ *H01L 21/565* (2013.01); *H01L 23/3121* (2013.01); *H01L 23/3735* (2013.01)

(56) References Cited

U.S. PATENT DOCUMENTS

2017/0271230 A1  9/2017  Inaba
2018/0315676 A1  11/2018  Gohara

FOREIGN PATENT DOCUMENTS

| JP | 53-120373 | 10/1978 |
| JP | 11-103001 | 4/1999 |
| JP | 2007-173272 | 7/2007 |
| JP | 2009-059812 | 3/2009 |
| JP | 2011-077280 | 4/2011 |
| JP | 2017-147295 | 8/2017 |
| WO | 2013/145620 | 10/2013 |

OTHER PUBLICATIONS

Novelty Search Report dated Apr. 16, 2020 in Netherlands Application No. 2023711, with English translation, 22 pages.

SEMICONDUCTOR DEVICE AND SEMICONDUCTOR DEVICE MANUFACTURING METHOD

This application is the U.S. national phase of International Application No. PCT/JP2018/046875 filed Dec. 19, 2018 which designated the U.S., the entire contents of which are hereby incorporated by reference.

TECHNICAL FIELD

The present invention relates to a semiconductor device and a semiconductor device manufacturing method.

BACKGROUND ART

Patent Document 1 discloses a semiconductor device in which a semiconductor chip (power semiconductor element) and one ends, in the longitudinal direction, of a plurality of pin terminals (external connection terminals) formed in a rod shape are joined to one surface of a substrate (power module substrate), and the substrate, the semiconductor device, and a portion on the one end side of each pin terminal are sealed with a sealing resin portion (sealing resin). In this semiconductor device, a portion on the other end side of each pin terminal protrudes from a flat outer surface of the sealing resin portion.

CITATION LIST

Patent Document

[Patent Document 1] Japanese Application Publication No. 2009-059812

SUMMARY OF THE INVENTION

Problems to be Solved by the Invention

Miniaturization is required for this type of semiconductor device. However, in the semiconductor device of Patent Document 1, it is necessary to secure a creeping distance from a predetermined pin terminal to another pin terminal along the outer surface of the sealing resin portion. For this reason, there is a problem that the space between the adjacent pin terminals cannot be reduced, thereby inhibiting the miniaturization of the semiconductor device.

The present invention has been made in view of such problems, and it is an object of the present invention to provide a semiconductor device and a semiconductor device manufacturing method capable of achieving miniaturization while securing a creeping distance between terminal pins.

Means for Solving the Problems

A semiconductor device according to one aspect of the present invention includes: a circuit unit including a semiconductor chip; a plurality of pin terminals formed in a rod shape extending in a same direction from the circuit unit and electrically connected to the circuit unit; a sealing resin portion sealing the circuit unit and first portions of the plurality of pin terminals positioned on a side of the circuit unit; and a plurality of covering resin portions integrally extending from an outer surface of the sealing resin portion from which second portions of the plurality of pin terminals protrude, the plurality of covering resin portions being formed in a cylindrical shape respectively covering base end portions of the second portions of the plurality of pin terminals, which are positioned on a side of the sealing resin portion.

A semiconductor device manufacturing method according to one aspect of the present invention includes: a connection step of electrically connecting a plurality of pin terminals to a circuit unit such that the plurality of pin terminals formed in a rod shape extend in a same direction from the circuit unit including a semiconductor chip; after the connection step, an accommodation step of accommodating the circuit unit and first portions of the plurality of pin terminals positioned on a side of the circuit unit in a first cavity of a mold, and inserting second portions of the plurality of pin terminals respectively in a plurality of pin insertion holes of the mold extending from an inner surface of the first cavity; after the accommodation step, a molding step of pouring a resin into the first cavity to form a sealing resin portion sealing the circuit unit and the first portions of the plurality of pin terminals, wherein: in the accommodation step, after inserting the second portions of the plurality of pin terminals respectively into the plurality of pin insertion holes, a pair of slide portions of the mold are caused to protrude from an inner circumference of each pin insertion hole and to sandwich a tip end portion of the second portion of each pin terminal positioned away from the first cavity, thereby forming a plurality of second cavities connected to the first cavity, the plurality of second cavities being surrounded by an outer circumference of a base end portion of the second portion of each pin terminal positioned close to the first cavity, the inner circumference of each pin insertion hole, and the pair of slide portions; and in the molding step, the resin is flown into the second cavity to form a plurality of cylindrical covering resin portions respectively covering the base end portions of the second portions of the plurality of pin terminals.

Effects of the Invention

According to the present invention, the miniaturization of the semiconductor device can be achieved.

MODE FOR CARRYING OUT THE INVENTION

Hereinafter, an embodiment of the present invention will be described with reference to FIGS. 1-10.

Figure 1:
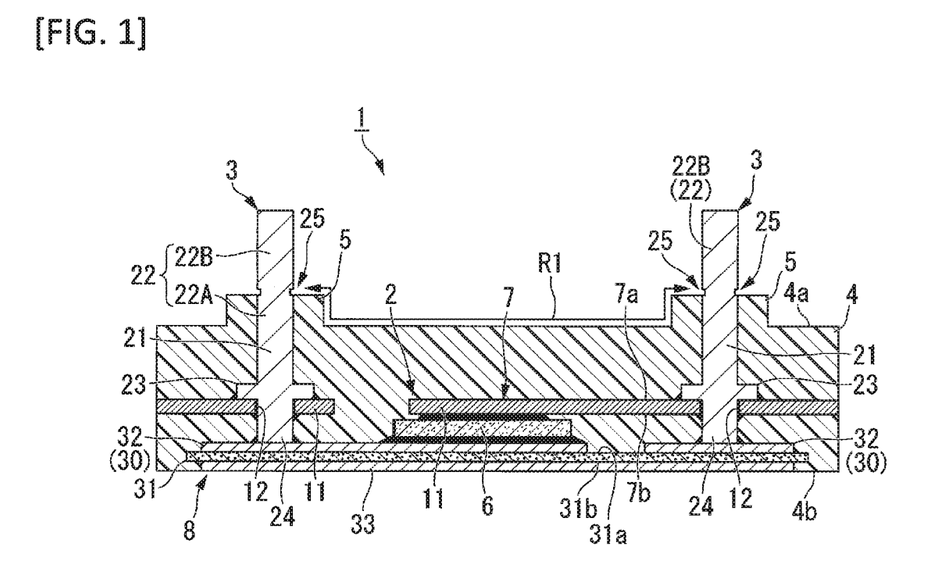
FIG. 1 is a cross-sectional view showing a semiconductor device according to an embodiment of the present invention.

As shown in FIG. 1, a semiconductor device 1 according to the present embodiment includes a circuit unit 2, a plurality of pin terminals 3, a sealing resin portion 4, and a plurality of covering resin portions 5.

The circuit unit 2 constitutes a circuit of the semiconductor device 1. The circuit unit 2 includes a semiconductor chip 6 and a wiring. The semiconductor chip 6 is formed in a plate shape, and has electrodes on both upper and lower surfaces. The semiconductor chip 6 of the present embodiment is a semiconductor element that generates heat by energization, such as a diode or a transistor. The wiring mainly connects the semiconductor chip 6 and the pin terminals 3 described later.

The circuit unit 2 of the present embodiment includes a plate-like lead frame 7 that constitutes the wiring of the circuit unit 2. The lead frame 7 is manufactured by punching a plate material having conductivity, such as a copper plate. In the semiconductor device 1, the lead frame 7 includes a plurality of leads 11 each formed in a band plate shape and spaced apart from each other. The lead frame 7 is formed with a plurality of insertion holes 12 penetrating in a plate thickness direction thereof. Specifically, the plurality of insertion holes 12 are formed respectively in the plurality of leads 11. Although the number of leads 11 or insertion holes 12 in FIG. 1 is two, it is not limited thereto.

One lead 11 of the lead frame 7 is joined by solder to the upper surface of the semiconductor chip 6.

The plurality of pin terminals 3 are formed in a bar shape extending in the same direction from the circuit unit 2. The plurality of pin terminals 3 are electrically connected to the wiring of the circuit unit 2. Although the number of pin terminals 3 in FIG. 1 is two, it is not limited thereto.

In the present embodiment, first portions 21 of the plurality of pin terminals 3 positioned on the lead frame 7 (circuit unit 2) side in a longitudinal direction of the pin terminals 3 are inserted respectively into the plurality of insertion holes 12 of the lead frame 7. Additionally, the first portion 21 of each pin terminal 3 is joined by solder to the lead frame 7. Thus, the plurality of pin terminals 3 are electrically connected to the lead frame 7. The plurality of pin terminals 3 are respectively connected to the plurality of different leads 11.

In this state, each pin terminal 3 extends long in a direction away from a first main surface 7a of the lead frame 7. In other words, a second portion 22 in the longitudinal direction of each pin terminal 3 is positioned on the first main surface 7a side of the lead frame 7. Additionally, a part of the first portion 21 of each pin terminal 3 protrudes from a second main surface 7b of the lead frame 7 opposing the first main surface 7a.

The first portion 21 of each pin terminal 3 is formed with an overhanging portion 23 that overhangs from an outer circumference of the pin terminal 3. The overhanging portion 23 is in surface contact with the first main surface 7a of the lead frame 7 in a state where the first portion 21 of the pin terminal 3 is inserted into the insertion hole 12 of the lead frame 7. Here, the overhanging portion 23 may, for example, be in surface contact with the second main surface 7b of the lead frame 7.

The overhanging portion 23 only needs to have a flat surface in surface contact with at least the first main surface 7a or the second main surface 7b of the lead frame 7, and may be formed in an arbitrary shape. The overhanging portion 23 of the present embodiment is formed in an annular shape extending in a circumferential direction of the pin terminal 3.

The semiconductor device 1 of the present embodiment further includes a wiring substrate 8. The wiring substrate 8 has a wiring portion 30 which constitutes the wiring of the circuit unit 2 together with the lead frame 7. The wiring substrate 8 is disposed to face the second main surface 7b of the lead frame 7. A portion of the first portion 21 of the pin terminal 3 protruding from the second main surface 7b of the lead frame 7 (hereinafter referred to as a protruding portion 24 of the pin terminal 3) is joined by solder to the wiring portion 30 of the wiring substrate 8.

The wiring substrate 8 may be, for example, a printed wiring substrate. The wiring substrate 8 of the present embodiment is a ceramic substrate 8 having a ceramic plate 31 and metal plate portions 32 and 33 formed on both main surfaces 31a and 31b thereof. The ceramic substrate 8 is disposed such that the first main surface 31a of the ceramic plate 31 faces the second main surface 7b of the lead frame 7. The first metal plate portion 32 formed on the first main surface 31a of the ceramic plate 31 constitutes the wiring portion 30 of the wiring substrate 8. The semiconductor chip 6 is joined to the first metal plate portion 32. The second metal plate portion 33 formed on the second main surface 31b of the ceramic plate 31 is formed in a region overlapping the first metal plate portion 32 in the thickness direction of the ceramic plate 31. The second metal plate portion 33 is electrically insulated from the first metal plate portion 32 by the ceramic plate 31.

Specifically, the plurality of first metal plate portions 32 are formed at an interval on the first main surface 31a of the ceramic plate 31. Although the number of first metal plate portions 32 in FIG. 1 is two, it is not limited thereto. One first metal plate portion 32 of the plurality of first metal plate portions 32 is joined by solder to the lower surface of the semiconductor chip 6. In other words, the semiconductor chip 6 is sandwiched between one first metal plate portion 32 (wiring substrate 8) and one lead 11 (lead frame 7). The protruding portions 24 of the plurality of pin terminals 3 are respectively joined by solder to the different first metal plate portions 32 (wiring portions 30).

Only one second metal plate portion 33 is formed on the second main surface 31b of the ceramic plate 31. The second metal plate portion 33 is formed over the entire region of the second main surface 31b of the ceramic plate 31, which overlaps the plurality of first metal plate portions 32.

The sealing resin portion 4 seals the circuit unit 2 including the semiconductor chip 6 and the lead frame 7, and the first portions 21 of the plurality of pin terminals 3. The second portions 22 of the plurality of pin terminals 3 protrude from an outer surface of the sealing resin portion 4. In the present embodiment, the outer surface of the sealing resin portion 4 from which the second portions 22 of the plurality of pin terminals 3 protrude is a flat upper surface 4a facing upward.

The sealing resin portion 4 of the present embodiment further seals the ceramic substrate 8 (wiring substrate 8). However, the second metal plate portion 33 of the ceramic substrate 8 is exposed to an outer surface of the sealing resin portion 4. In the present embodiment, the outer surface of the sealing resin portion 4 from which the second metal plate portion 33 is exposed is a flat lower surface 4b facing downward.

The plurality of covering resin portions 5 integrally extend from the upper surface 4a of the sealing resin portion 4 from which the second portions 22 of the plurality of pin terminals 3 protrude. In other words, the plurality of covering resin portions 5 are formed integrally with the sealing resin portion 4. Each covering resin portion 5 is formed in a cylindrical shape that covers a base end portion 22A of the second portion 22 of each pin terminal 3, which is positioned on the sealing resin portion 4 side. For this reason, only a tip end portion 22B of the second portion 22 of each pin terminal 3 protrudes from each covering resin portion 5.

Additionally, in the semiconductor device 1 of the present embodiment, the tip end portion 22B of the second portion 22 of each pin terminal 3 is formed with a pair of recessed portions 25 that are recessed from the outer circumference of the tip end portion 22B. The pair of recessed portions 25 is formed in a region of the tip end portion 22B of the second portion 22 of the pin terminal 3, which is adjacent to the covering resin portion 5 (base end portion 22A). The pair of recessed portions 25 formed in each pin terminal 3 are arranged in a radial direction of the pin terminal 3. The recessed portion 25 is formed in the method of manufacturing the semiconductor device 1 described later.

In the semiconductor device 1 of the present embodiment illustrated in FIG. 1, a current path from one pin terminal 3 to the other pin terminal 3 is formed by the semiconductor chip 6, the lead frame 7, and the first metal plate portion 32 of the ceramic substrate 8. Specifically, the semiconductor device 1 is formed the current path passing through one pin terminal 3 (and one lead 11), one first metal plate portion 32, the semiconductor chip 6, the other lead 11, and the other pin terminal 3 (and the other first metal plate portion 32) in this order.

Figure 2:
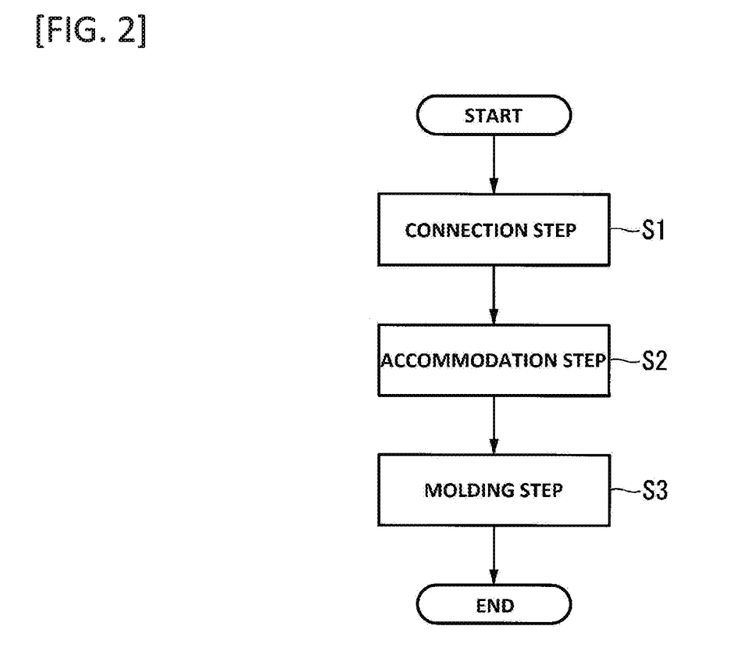
FIG. 2 is a flowchart showing a semiconductor device manufacturing method according to an embodiment of the present invention.

Next, a semiconductor device 1 manufacturing method of manufacturing the above-described semiconductor device 1 will be described. As shown in FIG. 2, the method of manufacturing the semiconductor device 1 includes a connection step S1, an accommodation step S2, and a molding step S3.

Figure 3:
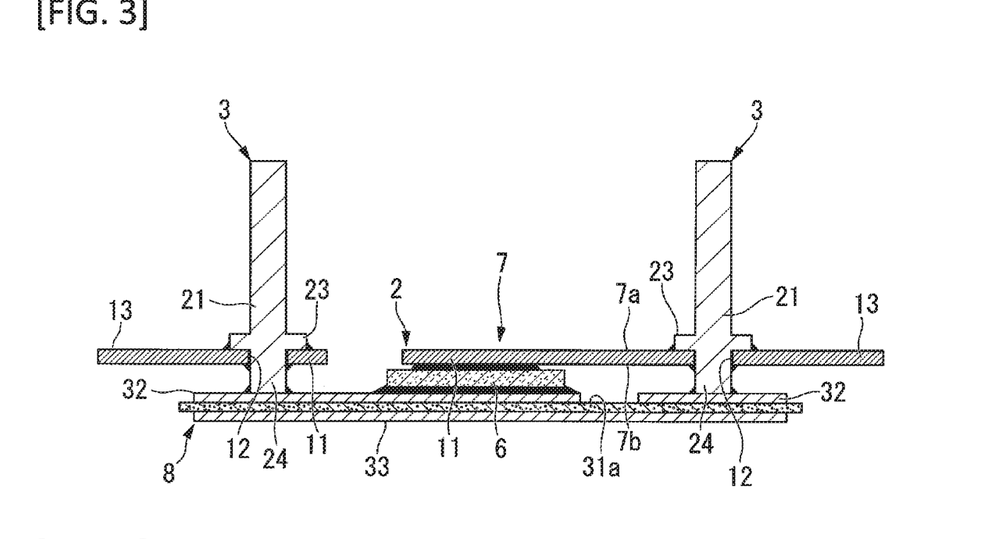
FIG. 3 is a cross-sectional view showing a manufacturing process of semiconductor device manufacturing method according to the embodiment of the present invention.

When manufacturing the semiconductor device 1, first, the connection step S1 is performed. In the connection step S1, as shown in FIG. 3, each pin terminal 3 is electrically connected to the circuit unit 2 so that the plurality of pin terminals 3 each formed in a bar shape protrude in the same direction from the circuit unit 2 including the semiconductor chip 6. In the connection step S1 of the present embodiment, the circuit unit 2 is formed by connecting the semiconductor chip 6, the lead frame 7, and the ceramic substrate 8 (wiring substrate 8) at the same time as connecting the pin terminals 3 to the circuit unit 2. Hereinafter, the connection process S1 of the present embodiment will be specifically described.

In the connection step S1 of the present embodiment, first, the semiconductor chip 6 is disposed on the first main surface 31a side of the ceramic substrate 8. Specifically, the semiconductor chip 6 is disposed so as to overlap the first metal plate portion 32 of the ceramic substrate 8.

Next, the lead frame 7 is disposed on the first main surface 31a side of the ceramic substrate 8. The lead frame 7 used here includes the plurality of leads 11 forming the wiring of the circuit unit 2, as well as a frame portion 13 that mutually connects the plurality of leads 11. The frame portion 13 is positioned outside the sealing resin portion 4 in a state in which the plurality of leads 11 are sealed by the sealing resin portion 4 described later. Additionally, the leads 11 of the lead frame 7 are formed respectively with the plurality of insertion holes 12 penetrating in the thickness direction of the lead frame 7. One lead 11 of the lead frame 7 is disposed so as to overlap the semiconductor chip 6.

In the state where the lead frame 7 is disposed as described above, the second main surface 7b of the lead frame 7 faces the first main surface 31a of the ceramic substrate 8. The first main surface 7a of the lead frame 7 opposing the second main surface 7b faces in the same direction as the first main surface 31a of the ceramic substrate 8.

Thereafter, the first portions 21 in the longitudinal direction of the plurality of pin terminals 3 are respectively inserted into the plurality of insertion holes 12 of the lead frame 7. In this state, the protruding portions 24 of the first portions 21 of the pin terminals 3, which protrude from the second main surfaces 7b of the lead frame 7, respectively contact the different first metal plate portions 32 of the ceramic substrate 8. Additionally, the overhanging portion 23 formed at the first portion 21 of each pin terminal 3 is in surface contact with the first main surface 7a of the lead frame 7.

Here, the step of inserting the first portions 21 of the pin terminals 3 into the insertion holes 12 of the lead frame 7 may be performed, for example, before disposing the lead frame 7 on the first main surface 31a side of the ceramic substrate 8. In this case, the lead frame 7 is disposed on the first main surface 31a side of the ceramic substrate 8 so that the protruding portion 24 of the first portion 21 of each pin terminal 3 contacts the corresponding one first metal plate portion 32 of the ceramic substrate 8.

Finally, the semiconductor chip 6, the lead frame 7, and the ceramic substrate 8 (wiring substrate 8) are electrically connected to one another by appropriately joining the semiconductor chip 6, the lead frame 7, the ceramic substrate 8, and the pin terminals 3. In other words, the circuit unit 2 is formed. Additionally, the pin terminals 3 are electrically connected to the circuit unit 2. The joining of the semiconductor chip 6, the lead frame 7, the ceramic substrate 8, and the pin terminals 3 can be performed by, for example, solder reflow. Solder paste for performing the solder reflow only need be applied to each joining portion before disposing the semiconductor chip 6, the lead frame 7, and the pin terminals 3 on the ceramic substrate 8 and before attaching the pin terminals 3 to the lead frame 7.

Thus, the connection step S1 of the present embodiment is completed.

As shown in FIG. 2, the accommodation step S2 is performed after the connection step S1. In the accommodation step S2, as shown in FIG. 5, a connection unit 10 which connected the circuit unit 2 and the plurality of pin terminals 3 is accommodated inside a mold 100.

The mold 100 has: a first cavity C1 accommodating the circuit unit 2 and the first portions 21 of the plurality of pin terminals 3 positioned on the circuit unit 2 side; and a plurality of pin insertion holes 101 for individually inserting the second portions 22 of the plurality of pin terminals 3 positioned away from the circuit unit 2. Each pin insertion hole 101 extends from an inner surface of the first cavity C1.

Figure 5:
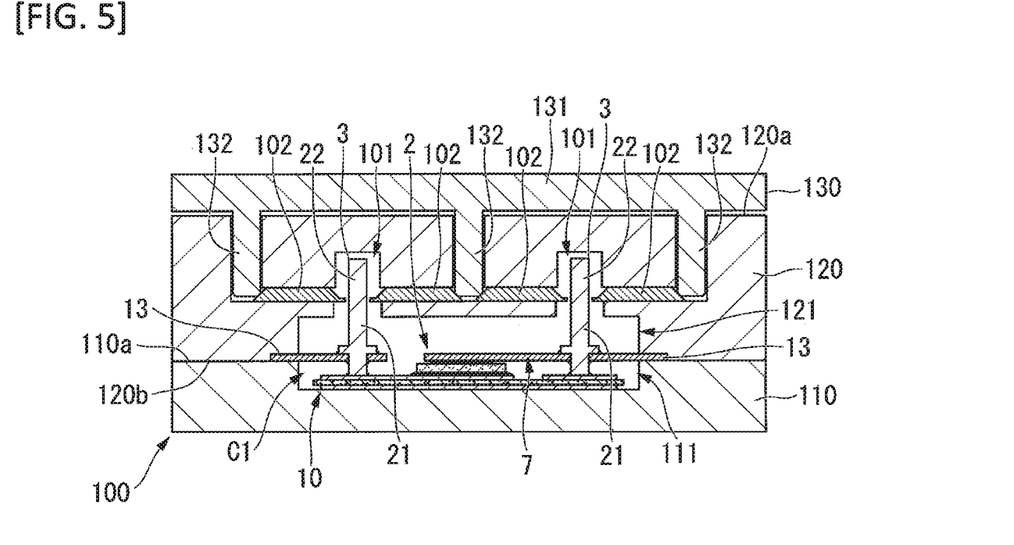
FIG. 5 is a cross-sectional view showing a manufacturing process of semiconductor device manufacturing method according to the embodiment of the present invention.

As shown in FIG. 5, a plurality of slide portions 102 are provided inside the mold 100. The slide portions 102 in a pair protrude from the inner circumference of each pin insertion hole 101. The pair of slide portions 102 are slidable in directions approaching or separating from each other in the radial direction of the corresponding pin insertion hole 101 (left and right directions in FIG. 5). The pair of slide portions 102 is disposed at a position away from the first cavity C1 in an extending direction (upward direction in FIG. 5) of the pin insertion hole 101 with respect to the pin insertion hole 101. The pair of slide portions 102 sandwiches the second portion 22 of the pin terminal 3 inserted into each pin insertion hole 101. The pair of slide portions 102 may be slidable, for example, to a position not protruding from the inner circumference of each pin insertion hole 101.

In the present embodiment, each slide portion 102 is formed in a plate shape whose thickness direction is the extending direction of the pin insertion hole 101. The plate thickness of each slide portion 102 is smaller than the dimension in the extending direction of the pin insertion hole 101. Each slide portion 102 is disposed at a position apart from the tip end (upper end in FIG. 5) of the pin insertion hole 101 in the extending direction of the pin insertion hole 101. That is, each slide portion 102 is positioned between the base end (the end on the first cavity C1 side) and the tip end of the pin insertion hole 101 in the extending direction of the pin insertion hole 101.

Figure 8:
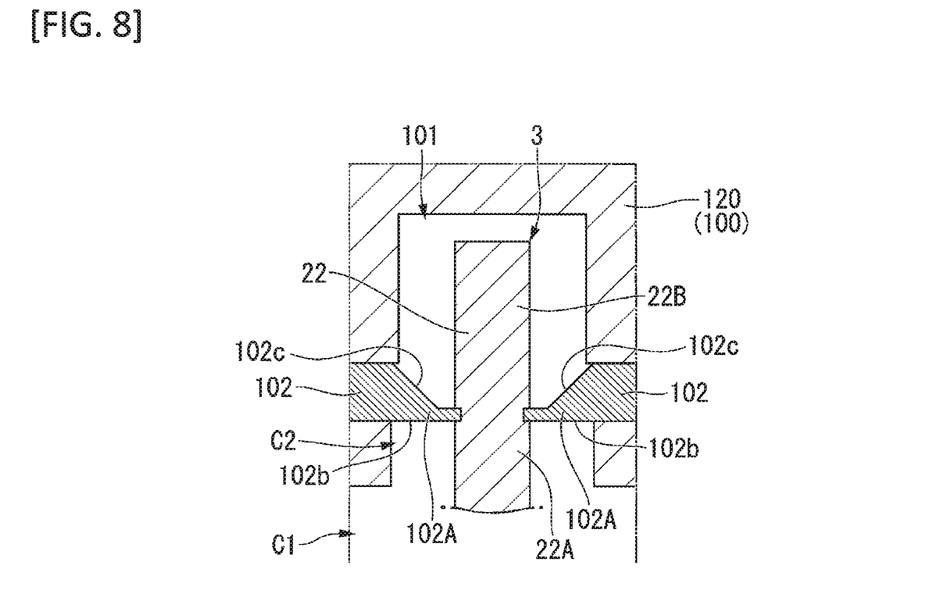
FIG. 8 is an enlarged sectional view showing a relationship between a pin terminal and the slide portion in the state of FIG. 7.

As shown in FIG. 8, the tip end portion 102A in the projecting direction of the slide portion 102 with respect to the pin insertion hole 101 is formed in a tapered shape. Specifically, the tip end portion 102A of the slide portion 102 is formed such that the thickness of the slide portion 102 becomes smaller as it approaches the tip end of the slide portion 102 in the projecting direction. A first surface 102b of the tip end portion 102A of the slide portion 102, which faces the first cavity C1 side in the thickness direction of the slide portion 102, extends in the protruding direction of the slide portion 102 (direction orthogonal to the extending direction of the pin insertion hole 101). On the other hand, a second surface 102c of the tip end portion 102A of the slide portion 102, which faces the tip end side of the pin insertion hole 101, tilts so as to be closer to the first surface 102b as it approaches the tip end of the slide portion 102 in the projecting direction.

Here, the thickness of the tip end portion 102A of the slide portion 102 may be, for example, the same as the thickness of another portion of the slide portion 102. That is, the thickness of the slide portion 102 may be constant.

Figure 6:
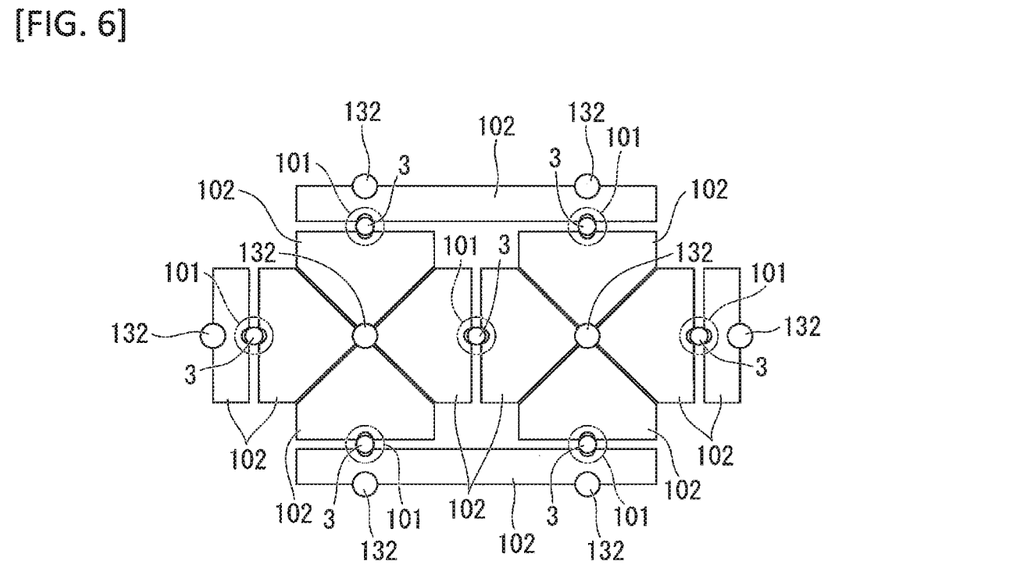
FIG. 6 schematically shows an example of the arrangement of a plurality of slide portions in the state of FIGS. 4 and 5.

Further, as shown in FIG. 6, in plan view seen from the extending direction of the pin insertion hole 101, the tip end of each slide portion 102 in contact with the circumferential surface of the pin terminal 3 is formed in an arc shape corresponding to the shape of the circumferential surface of the pin terminal 3.

The pin terminal 3 of the present embodiment is formed in a circular shape when viewed from the longitudinal direction. For this reason, the tip end of the slide portion 102 is formed in an arc shape (semicircle shape). Thus, in a state in which the second portion 22 of the pin terminal 3 is sandwiched by the pair of slide portions 102, the pair of slide portions 102 is pressed against the entire circumferential direction of the pin terminal 3.

Although the number of slide portions 102 in the mold 100 may be, for example, twice the number of pin insertion holes 101 (pin terminals 3), it may be, for example, less than the twice the number of pin insertion holes 101, as shown in FIG. 6. In the configuration illustrated in FIG. 6, some of the slide portions 102 is provided for the two pin insertion holes 101.

Figure 4:
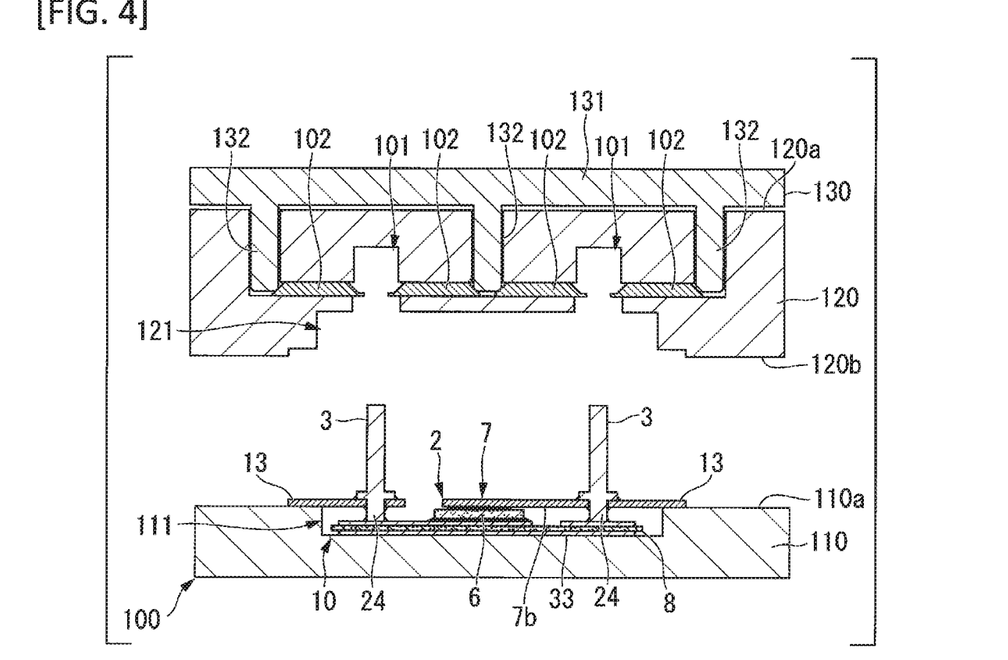
FIG. 4 is a cross-sectional view showing a manufacturing process of semiconductor device manufacturing method according to the embodiment of the present invention.

More specifically, as shown in FIGS. 4 and 5, the mold 100 of the present embodiment has a lower mold 110 and an upper mold 120 which are movable in the vertical direction.

The lower mold 110 is formed with a first concave portion 111 which is recessed from an upper surface 110a facing the upper mold 120. On the other hand, the upper mold 120 is formed with a second concave portion 121 which is recessed from a lower surface 120b facing the lower mold 110. The first concave portion 111 of the lower mold 110 and the second concave portion 121 of the upper mold 120 constitute the first cavity C1 when the lower mold 110 and the upper mold 120 are stacked.

The upper mold 120 is formed with a plurality of pin insertion holes 101. Each pin insertion hole 101 extends upward from a bottom surface of the second concave portion 121. Additionally, the plurality of slide portions 102 are provided inside the upper mold 120.

Furthermore, the mold 100 of the present embodiment has a driving member 130 for causing the pair of slide portions 102 corresponding to each pin insertion hole 101 to slide in the direction in which they approach each other. The driving member 130 has a main body portion 131 and a plurality of pressing portions 132.

The main body portion 131 is disposed on the upper surface 120a of the upper mold 120 (surface opposing the lower surface 120b). The plurality of pressing portions 132 are each formed in a bar shape so as to protrude from the main body portion 131 into the inside of the upper mold 120. The tip end of each pressing portion 132 contacts the base end portion of the slide portion 102 in the protruding direction. As the pressing portion 132 is pressed against the base end portion of the slide portion 102, the slide portion 102 slides in its protruding direction (see FIG. 7). On the other hand, as the pressing portion 132 moves in the direction away from the base end portion of the slide portion 102 (upward in FIGS. 5 and 7), the slide portion 102 slides in the direction opposite to its protruding direction (see FIG. 5). At this time, the slide portion 102 may slide in the direction opposite to the protruding direction by, for example, an elastic force of a spring or the like.

Figure 7:
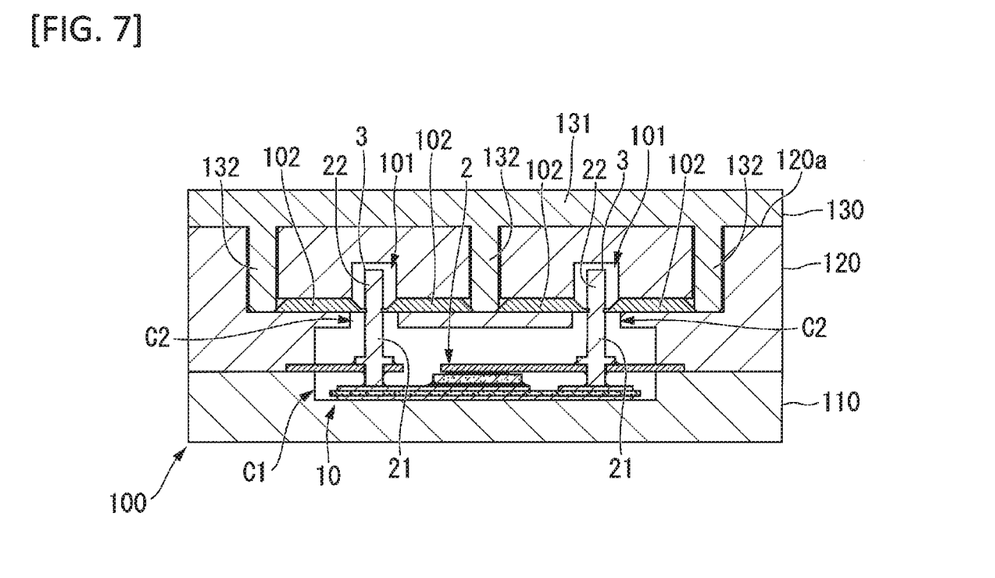
FIG. 7 is a cross-sectional view showing a manufacturing process of semiconductor device manufacturing method according to the embodiment of the present invention.

The plurality of pressing portions 132 are provided integrally with the main body portion 131. For this reason, as shown in FIG. 7, as the main body portion 131 moves toward the upper surface 120a of the upper mold 120, the plurality of slide portions 102 simultaneously slide in the protruding direction. That is, the pair of slide portions 102 corresponding to the same pin insertion hole 101 can slide in the direction in which they approach each other. On the other hand, as shown in FIG. 5, as the main body portion 131 moves in the direction away from the upper surface 120a of the upper mold 120, the plurality of slide portions 102 simultaneously slide in the direction opposite to the protruding direction.

Although the number of pressing portions 132 in the driving member 130 may be, for example, twice the number of pin insertion holes 101, it may be, for example, less than twice the number of pin insertion holes 101, as shown in FIG. 6. In the configuration illustrated in FIG. 6, some of the pressing portions 132 is provided for the plurality of (four in FIG. 6) slide portions 102 each corresponding to different pin insertion holes 101.

Here, the configuration for causing the slide portion 102 to slide in the direction opposite to the protruding direction is not limited to a spring or the like and may be arbitrary. The configuration for causing the slide portion 102 to slide in the direction opposite to the protruding direction may be, for example, another driving member having a main body portion and a pressing portion, similarly to the driving member 130 described above. The other driving member pushes the pressing portion toward the slide portion 102, thereby causing the slide portion 102 to slide in the direction opposite to the protruding direction, that is, causing the pair of slide portions 102 corresponding to each pin insertion hole 101 to slide in the direction in which they separate from each other.

In the accommodation step S2 of the present embodiment, first, as shown in FIG. 4, the connection unit 10 is placed on the lower mold 110 of the mold 100. In this state, the second metal plate portion 33 of the ceramic substrate 8 in the connection unit 10 is in surface contact with the bottom surface of the first concave portion 111 of the lower mold 110. Further, the frame portion 13 of the lead frame 7 is placed on the upper surface 110a of the lower mold 110. In the first concave portion 111, portions of the connection unit 10 on the second main surface 7b side of the lead frame 7 (the ceramic substrate 8, the semiconductor chip 6, and the protruding portions 24 of the plurality of pin terminals 3) are accommodated.

Next, as shown in FIG. 5, the upper mold 120 is stacked on the lower mold 110. In this state, the first cavity C1 including the first concave portion 111 of the lower mold 110 and the second concave portion 121 of the upper mold 120 is formed. The first cavity C1 accommodates the circuit unit 2 and the first portions 21 of the plurality of pin terminals 3 (positioned on the circuit unit 2 side) of the connection unit 10. Further, the second portions 22 of the plurality of pin terminals 3 are inserted into the plurality of pin insertion holes 101 of the upper mold 120. Further, the frame portion 13 of the lead frame 7 is sandwiched between the lower mold 110 and the upper mold 120.

Furthermore, in the accommodation step S2, after inserting the second portion 22 of each pin terminal 3 into each pin insertion hole 101, as shown in FIGS. 7 and 8, the pair of slide portions 102 is caused to protrude from the inner circumference of each pin insertion hole 101, so that the tip end portion 22B of the second portion 22 of each pin terminal 3 is sandwiched by the pair of slide portions 102. The tip end portion 22B of the second portion 22 of the pin terminal 3 is a portion of the second portion 22 of the pin terminal 3 inserted into the pin insertion hole 101, which is positioned apart from the first cavity C1.

When sandwiching the tip end portion 22B of the second portion 22 of the pin terminal 3, the main body 131 of the driving member 130 is moved toward the upper surface 120a of the upper mold 120. As a result, the pair of slide portions 102 corresponding to the same pin insertion hole 101 slides in the direction in which they approach each other, thereby sandwiching the tip end portion 22B of the second portion 22 of the pin terminal 3. Further, the tip end portions 22B of the second portions 22 of the plurality of pin terminals 3 inserted into the plurality of pin insertion holes 101 are each sandwiched simultaneously by the pair of slide portions 102.

In the accommodation step S2 of the present embodiment, the pair of slide portions 102 sandwich a part of the tip end portion 22B of the second portion 22 of the pin terminal 3, which is adjacent to the base end portion 22A of the second portion 22 of the pin terminal 3. That is, the pair of slide portions 102 does not sandwich a part of the tip end portion 22B of the second portion 22 of the pin terminal 3, which is apart from the base end portion 22A of the second portion 22 of the pin terminal 3. The base end portion 22A of the second portion 22 of the pin terminal 3 is a portion of the second portion 22 of the pin terminal 3 inserted into the pin insertion hole 101, which is positioned close to the first cavity C1.

Here, the pair of slide portions 102 may sandwich, for example, the entire tip end portion 22B of the second portion 22 of the pin terminal 3.

Furthermore, in the accommodation step S2 of the present embodiment, when the tip end portion 22B of the second portion 22 of each pin terminal 3 is sandwiched by the pair of slide portions 102, the tip end portions 102A of the pair of slide portions 102 each bite into the outer circumference of the tip end portion 22B of the second portion 22 of each pin terminal 3. In the present embodiment, since the tip end portion 102A of the slide portion 102 is formed in the tapered shape, the tip end portion 102A of the slide portion 102 can reliably bite into the outer circumference of the pin terminal 3.

Furthermore, in the state in which the tip end portion 22B of the second portion 22 of each pin terminal 3 is sandwiched by the pair of slide portions 102, a plurality of second cavities C2 are formed. Each second cavity C2 is a space surrounded by the outer circumference of the base end portion 22A of the second portion 22 of each pin terminal 3, the inner circumference of each pin insertion hole 101 facing thereto, and the pair of slide portions 102, and is connected to one cavity C1. The second cavity C2 is formed for each pin insertion hole 101.

Figure 9:
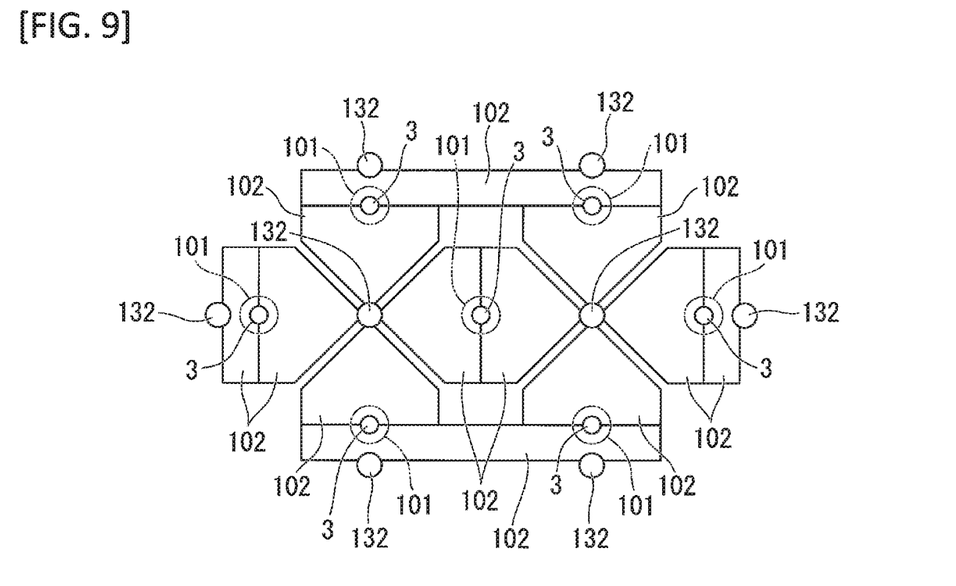
FIG. 9 is a view schematically showing an example of the arrangement of the plurality of slide portions in the state of FIG. 7.

Each second cavity C2 is a space on the base end side (first cavity C1 side) of each pin insertion hole 101, and is divided from the space on the tip end side of each pin insertion hole 101 by the pair of slide portions 102 and the pin terminal 3. As shown in FIG. 9, the tip ends of the pair of slide portions 102 are pressed against, and thus in close contact with, the circumference of the pin terminal 3, and the tip ends of the pair of slide portions 102 are in close contact with each other, thereby dividing the space at the base end side of the pin insertion hole 101 and the space at the tip end side of the pin insertion hole 101 from each other.

Thus, the accommodation step S2 of the present embodiment is completed.

As shown in FIG. 2, the molding step S3 is performed after the accommodation step S2, thus completing the method of manufacturing the semiconductor device 1.

Figure 10:
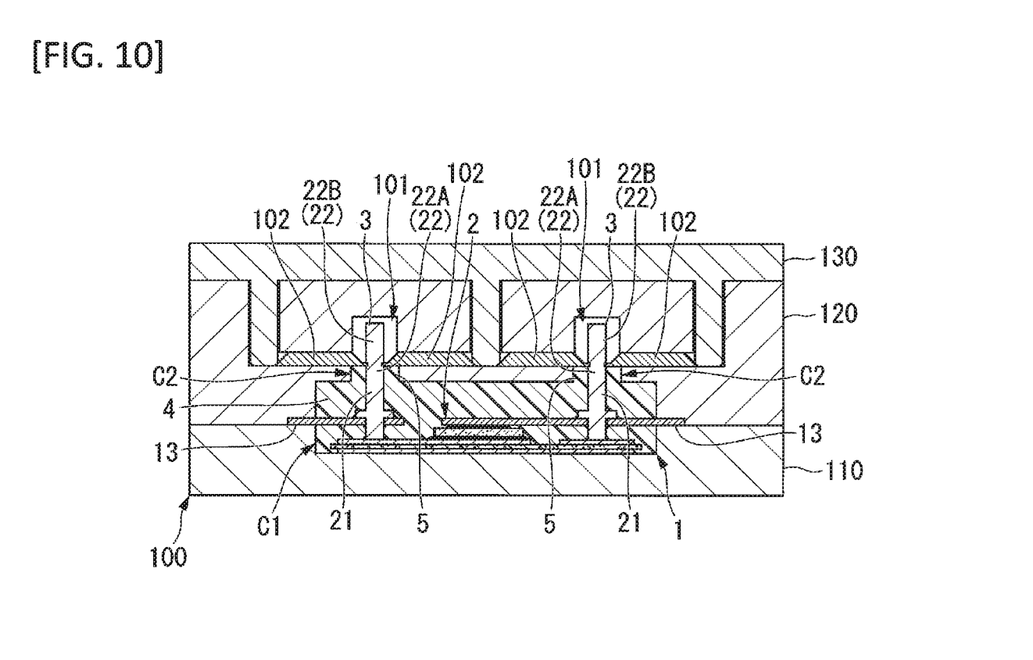
FIG. 10 is a cross-sectional view showing a manufacturing process of semiconductor device manufacturing method according to the embodiment of the present invention.

In the molding step S3, as shown in FIG. 10, a resin is poured into the first cavity C1 to form the sealing resin portion 4 that seals the circuit unit 2 and the first portions 21 of the plurality of pin terminals 3. Further, in the molding step S3, the resin poured into the first cavity C1 is flown into the second cavity C2 to form the cylindrical covering resin portion 5 that covers the base end portion 22A of the second portion 22 of each pin terminal 3. In the molding step S3, a plurality of covering resin portions 5 corresponding respectively to the plurality of pin terminals 3 are formed.

In the molding step S3, the semiconductor device 1 is taken out of the mold 100 after the resin forming the sealing resin portion 4 and the covering resin portion 5 is cured. When taking the semiconductor device 1 out of the mold 100, first, the driving member 130 is moved upward with respect to the upper mold 120, so that the pair of slide portions 102 corresponding to each pin insertion holes 101 slides in the direction in which they separate from each other. Thereafter, the upper mold 120 and the lower mold 110 are moved away from each other, so that the semiconductor device 1 can be taken out of the mold 100.

Further, in the manufacturing method of the present embodiment, after the semiconductor device 1 is taken out of the mold 100, the frame portion 13 of the lead frame 7 protruding from the sealing resin portion 4 is cut off. Thereby, the semiconductor device 1 shown in FIG. 1 is completed.

In the manufactured semiconductor device 1, the pair of recessed portions 25 of each pin terminal 3 is formed by the tip end portions 102A of the pair of slide portions 102 biting into the outer circumference of the tip end portion 22B of the second portion 22 of each pin terminal 3 in the accommodation step S2.

As described above, according to the semiconductor device 1 of the present embodiment, the base end portions 22A of the second portions 22 of the plurality of pin terminals 3 protruding from the upper surface 4a (outer surface) of the sealing resin portion 4 are each covered with the cylindrical covering resin portion 5 extending from the upper surface 4a of the sealing resin portion 4. Therefore, the creeping distance R1 from the predetermined pin terminal 3 to the other pin terminal 3 is the distance which is a sum of the length of the outer surface of the sealing resin portion 4 and the lengths of the outer surfaces of the two covering resin portions 5 which respectively cover the two pin terminals 3 (see FIG. 1). That is, the creeping distance R1 from a predetermined pin terminal 3 to another pin terminal 3 can be extended. As a result, even if the distance between two adjacent pin terminals 3 is reduced, it is possible to secure the creeping distance R1. As a result, the semiconductor device 1 can be miniaturized.

According to the method of manufacturing the semiconductor device 1 of the present embodiment, the semiconductor device 1 of the present embodiment can be manufactured.

Further, according to the method of manufacturing the semiconductor device 1 of the present embodiment, in the accommodation step S2, the tip end portion 22B of the second portion 22 of each pin terminal 3 is sandwiched by the pair of slide portions 102. Thereby, the resin flowing into the second cavity C2 in the molding step S3 can be prevented from reaching the outer circumference of the tip end portion 22B of the second portion 22 of each pin terminal 3. That is, it is possible to suppress the resin from adhering to the tip end portion 22B of the second portion 22 of the pin terminal 3 functioning as an external connection terminal.

According to the semiconductor device 1 of the present embodiment, the first portions 21 of the plurality of pin terminals 3 are respectively inserted into the plurality of insertion holes 12 of the lead frame 7. Further, according to the method of manufacturing the semiconductor device 1 of the present embodiment, in the connection step S1, the first portions 21 of the plurality of pin terminals 3 are respectively inserted into the plurality of insertion holes 12 of the lead frame 7.

The plurality of insertion holes 12 of the lead frame 7 can be formed by punching with high accuracy. Therefore, the relative positions of the plurality of pin terminals 3 can be accurately positioned in the connection step S1. Thus, the plurality of pin terminals 3 can be accurately positioned with respect to the plurality of pin insertion holes 101 of the mold 100 in the accommodation step S2.

Accordingly, it is possible to suppress or prevent the base end portion 22A of the second portion 22 of the pin terminal 3 from, for example, coming into contact with the inner circumference of the pin insertion hole 101, thereby causing the base end portion 22A of the second portion 22 of the pin terminal 3 to be exposed from the covering resin portion 5. That is, the base end portions 22A of the second portions 22 of the plurality of pin terminals 3 can be reliably covered with the covering resin portions 5. Further, the thickness of the covering resin portion 5 in the circumferential direction of the pin terminal 3 can be made uniform.

Further, since positional deviation of the pin terminal 3 with respect to the pin insertion hole 101 can be suppressed, when the pin terminal 3 is sandwiched by the pair of slide portions 102, the pair of slide portions 102 can be pressed against the outer circumference of the pin terminal 3 with equal force. Thereby, when sandwiching the pin terminal 3 by the pair of slide portions 102, it is possible to suppress the pin terminal 3 from deforming (for example, the pin terminal 3 from bending).

In the semiconductor device 1 and the method of manufacturing the semiconductor device 1 according to the present embodiment, the overhanging portion 23 formed in the first portion 21 of each pin terminal 3 is in surface contact with the first main surface 7a (main surface) of the lead frame 7. Thereby, each pin terminal 3 can stably be attached to the lead frame 7. For example, in a state in which the first portion 21 of each pin terminal 3 is inserted into the insertion hole 12 of the lead frame 7, it is possible to prevent deviation of the direction of the axis of the pin terminal 3 with respect to the first main surface 7a of the lead frame 7. Therefore, the plurality of pin terminals 3 can be positioned with respect to the lead frame 7 with higher accuracy.

In the semiconductor device 1 of the present embodiment, the lead frame 7 and the wiring substrate 8 which constitute the wiring of the circuit unit 2 are arranged in the thickness direction thereof. That is, the wiring of the circuit unit 2 is divided into two layers. Therefore, the size of the semiconductor device 1 in the direction orthogonal to the thickness direction of the lead frame 7 or the wiring substrate 8 can be reduced as compared to the case where the wiring of the circuit unit 2 is formed in one layer. Therefore, the semiconductor device 1 can be further miniaturized.

In the semiconductor device 1 of the present embodiment, since the wiring of the circuit unit 2 is configured by the lead frame 7 and the wiring unit 30 of the wiring substrate 8 which are arranged in the plate thickness direction, the length of the wiring in the circuit unit 2 can be shortened. Therefore, the resistance and the inductance of the wiring of the circuit unit 2 can be reduced.

For example, when the wiring of the circuit unit 2 is constituted of only the lead frame 7 or only the wiring portion 30 of the wiring substrate 8, the electrode of the semiconductor chip 6 and the lead frame 7 or the wiring portion 30 of the wiring substrate 8 need be electrically connected by bonding wires or connection plates. When a bonding wire or a connection plate is used for wiring of the circuit unit 2, the wiring of the circuit unit 2 becomes long.

On the other hand, when the wiring of the circuit section 2 is constituted of the lead frame 7 and the wiring unit 30 of the wiring substrate 8 which are arranged in the thickness direction, the above-mentioned bonding wires and connection plates (clips) become unnecessary. For this reason, the length of the wiring of the circuit unit 2 can be shortened. Therefore, the resistance and the inductance of the wiring of the circuit unit 2 can be reduced.

According to the semiconductor device 1 of the present embodiment, the semiconductor chip 6 is joined to the first metal plate portion 32 formed on the first main surface 31a of the ceramic plate 31. In addition, the second metal plate portion 33 formed on the second main surface 31b of the ceramic plate 31 is formed in the region overlapping the first metal plate portion 32 in the thickness direction of the ceramic plate 31, and is exposed to the lower surface 4b (outer surface) of the sealing resin portion 4. Therefore, the heat generated in the semiconductor chip 6 can be efficiently dissipated to the outside of the semiconductor device 1 through the ceramic substrate 8 (the first metal plate portion 32, the ceramic plate 31, the second metal plate portion 33). In particular, by placing the semiconductor device 1 on a heat dissipation member so that the second metal plate portion 33 contacts the heat dissipation member made of aluminum or the like, the heat of the semiconductor chip 6 can be efficiently dissipated to the heat dissipation member.

According to the method of manufacturing the semiconductor device 1 of the present embodiment, the pair of slide portions 102 of the mold 100 is formed in a plate shape whose thickness direction is the extending direction of the pin insertion hole 101. Further, in the accommodation step S2, the pair of slide portions 102 sandwiches a part of the tip end portion 22B of the second portion 22 of the pin terminal 3, which is adjacent to the base end portion 22A of the second portion 22 of the pin terminal 3, and does not sandwich a part of the tip end portion 22B of the second portion 22 of the pin terminal 3, which is apart from the base end portion 22A of the second portion 22 of the pin terminal 3. Therefore, in a state where the second portion 22 of the pin terminal 3 is sandwiched by the pair of slide portions 102 in the accommodation step S2, it is possible to suppress or prevent a gap from being generated between each slide portion 102 and the outer circumference of the pin terminal 3. Moreover, protection of the pin terminal 3 can also be achieved. Hereinafter, this point will be described.

For example, when the longitudinal direction of the second portion 22 of the pin terminal 3 inserted into the pin insertion hole 101 is inclined with respect to the extending direction of the pin insertion hole 101, if the pair of slide portions 102 sandwiches the entire tip end portion 22B of the second portions 22 of the pin terminal 3, a gap may be generated between each slide portion 102 and the outer circumference of the pin terminal 3. Further, it is not preferable that the pair of slide portions 102 sandwich the entire tip end portion 22B of the second portion 22 of the pin terminal 3 because a stress to bend the second portion 22 of the pin terminal 3 acts on the second portion 22.

On the other hand, when the pair of slide portions 102 sandwiches the part of the tip end portion 22B of the second part 22 of the pin terminal 3, which is adjacent to the base end portion 22A of the second part 22 of the pin terminal 3, even if the longitudinal direction of the second portions 22 of the pin terminal 3 is inclined, it is possible to suppress or prevent a gap from being generated between each slide portion 102 and the outer circumference of the pin terminal 3. Moreover, it is also possible to suppress the stress to bend the second portion 22 of the pin terminal 3 from acting on the second portion 22.

From the above, it is possible to effectively suppress the resin flowing into the second cavity C2 from reaching the outer circumference of the tip end portion 22B of the second portion 22 of each pin terminal 3 in the molding step S3. Moreover, protection of the pin terminal 3 can also be achieved.

According to the method of manufacturing the semiconductor device 1 of the present embodiment, when the tip end portion 22B of the second portion 22 of each pin terminal 3 is sandwiched by the pair of slide portions 102 in the accommodation step S2, the tip end portions of the pair of slide portions 102 each bite into the outer circumference of the tip end portion 22B of the second portion 22 of the pin terminal 3. In particular, in the present embodiment, since the tip end portion 102A of each slide portion 102 is formed in the tapered shape, the tip end portion 102A of each slide portion 102 can reliably bite into the outer circumference of the tip end portion 22B of the second portion 22 of the pin terminal 3. Thus, it is possible to reliably prevent the resin flowing into the second cavity C2 from reaching the outer circumference of the tip end portion 22B of the second portion 22 of each pin terminal 3 in the molding step S3.

As described above, although the details of the present invention have been described, the present invention is not limited to the embodiment described above, and various changes can be added without deviating from the gist of the present invention.

DESCRIPTION OF REFERENCE NUMERALS 1 semiconductor device
2 circuit unit
3 pin terminal
4 sealing resin portion
4a upper surface (outer surface)
4b bottom surface (outer surface)
5 covering resin portion
6 semiconductor chip
7 lead frame
7a first main surface
7b second main surface
8 ceramic substrate (wiring substrate)
12 insertion hole
21 first portion
22 second portion
22A base end portion
22B tip end portion
23 overhanging portion
25 recessed portion
30 wiring unit
31 ceramic plate
31a first main surface
31b second main surface
32 first metal plate portion
33 second metal plate portion
100 mold
101 pin insertion hole
102 slide portion
102A tip end portion
110 lower mold
120 upper mold
130 driving member

The invention claimed is:
1. A semiconductor device comprising:
a circuit unit including a semiconductor chip;
a plurality of pin terminals formed in a rod shape extending in a same direction from the circuit unit and electrically connected to the circuit unit;
a sealing resin portion sealing the circuit unit and first portions of the plurality of pin terminals positioned on a side of the circuit unit; and
a plurality of covering resin portions integrally extending from an outer surface of the sealing resin portion from which second portions of the plurality of pin terminals protrude, the plurality of covering resin portions being formed in a cylindrical shape respectively covering base end portions of the second portions of the plurality of pin terminals, which are positioned on a side of the sealing resin portion, wherein
each of tip end portions of the second portions of the plurality of pin terminals has a pair of recessed portions in a region adjacent to the covering resin portion, the pair of recessed portions being recessed inward from an outer circumference of the tip end portion.
2. The semiconductor device according to claim 1, wherein
the circuit unit includes a plate-like lead frame that configures a wiring of the circuit unit, the lead frame is formed with a plurality of insertion holes penetrating in a thickness direction of the lead frame, and the first portions of the plurality of pin terminals are respectively inserted into the plurality of insertion holes.

3. The semiconductor device according to claim 2, wherein the first portion of the pin terminal is formed with an overhanging portion overhanging from an outer circumference of the pin terminal and in surface contact with a main surface of the lead frame.

4. The semiconductor device according to claim 2, wherein the second portion of the pin terminal is positioned on a side of a first main surface of the lead frame, and the semiconductor device comprises a wiring substrate having a wiring unit, the wiring unit and the lead frame constituting the wiring of the circuit unit, and the wiring substrate facing a second main surface of the lead frame opposing the first main surface of the lead frame and being sealed in the sealing resin portion, and a part of the first portion of the pin terminal, which protrudes from the second main surface of the lead frame, is joined to the wiring unit of the wiring substrate.

5. The semiconductor device according to claim 4, wherein the wiring substrate is a ceramic substrate having a ceramic plate and metal plate portions formed on both main surfaces of the ceramic plate, a first metal plate portion formed on a first main surface of the ceramic plate facing the second main surface of the lead frame constitutes the wiring unit, the semiconductor chip is joined to the first metal plate portion, and a second metal plate portion formed on a second main surface of the ceramic plate is formed in a region overlapping the first metal plate portion in the thickness direction of the ceramic plate, and is exposed to an outer surface of the sealing resin portion.

6. A semiconductor device manufacturing method comprising:

a connection step of electrically connecting a plurality of pin terminals to a circuit unit such that the plurality of pin terminals formed in a rod shape extend in a same direction from the circuit unit including a semiconductor chip;

after the connection step, an accommodation step of accommodating the circuit unit and first portions of the plurality of pin terminals positioned on a side of the circuit unit in a first cavity of a mold, and inserting second portions of the plurality of pin terminals respectively in a plurality of pin insertion holes of the mold extending from an inner surface of the first cavity;

after the accommodation step, a molding step of pouring a resin into the first cavity to form a sealing resin portion sealing the circuit unit and the first portions of the plurality of pin terminals, wherein in the accommodation step, after inserting the second portions of the plurality of pin terminals respectively into the plurality of pin insertion holes, a pair of slide portions of the mold are caused to protrude from an inner circumference of each pin insertion hole and to sandwich a tip end portion of the second portion of each pin terminal positioned away from the first cavity, thereby forming a plurality of second cavities connected to the first cavity, the plurality of second cavities being surrounded by an outer circumference of a base end portion of the second portion of each pin terminal positioned close to the first cavity, the inner circumference of each pin insertion hole, and the pair of slide portions, and in the molding step, the resin is flown into the second cavity to form a plurality of cylindrical covering resin portions respectively covering the base end portions of the second portions of the plurality of pin terminals.

7. The semiconductor device manufacturing method according to claim 6, wherein the pair of slide portions are each formed in a plate shape whose thickness direction is an extending direction of the pin insertion hole, and in the accommodation step, a part of the tip end portion of the second portion of each pin terminal, which is adjacent to the base end portion of the second portion of the pin terminal, is sandwiched by the pair of slide portions.

8. The semiconductor device manufacturing method according to claim 7, wherein in the accommodation step, when the tip end portion of the second portion of each pin terminal is sandwiched by the pair of slide portions, tip end portions of the pair of slide portions protruding from the inner circumference of each pin insertion hole bite into the outer circumference of the tip end portion of the second portion of each pin terminal.

9. The semiconductor device manufacturing method according to claim 8, wherein the tip end portions of the slide portions are formed in a tapered shape.

10. The semiconductor device manufacturing method according to claim 6, wherein the circuit unit includes a plate-like lead frame that constitutes a wiring of the circuit unit, the lead frame is formed with a plurality of insertion holes penetrating in a thickness direction of the lead frame, and in the connection step, the first portions of the plurality of pin terminals are respectively inserted into the plurality of insertion holes.

* * * * *